(12) United States Patent
Yaguchi et al.

(10) Patent No.: US 9,378,922 B2
(45) Date of Patent: Jun. 28, 2016

(54) ELECTRON MICROSCOPE AND ELECTRON MICROSCOPE SAMPLE RETAINING DEVICE

(71) Applicant: Hitachi High-Technologies Corporation, Tokyo (JP)

(72) Inventors: Toshie Yaguchi, Tokyo (JP); Yasuhira Nagakubo, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/417,345

(22) PCT Filed: Jun. 19, 2013

(86) PCT No.: PCT/JP2013/066776
§ 371 (c)(1),
(2) Date: Jan. 26, 2015

(87) PCT Pub. No.: WO2014/017225
PCT Pub. Date: Jan. 30, 2014

(65) Prior Publication Data
US 2015/0179396 A1    Jun. 25, 2015

(30) Foreign Application Priority Data

Jul. 27, 2012    (JP) ................. 2012-166492

(51) Int. Cl.
*H01J 37/26* (2006.01)
*H01J 37/20* (2006.01)
*H01J 37/244* (2006.01)

(52) U.S. Cl.
CPC ............... *H01J 37/20* (2013.01); *H01J 37/244* (2013.01); *H01J 37/26* (2013.01); *H01J 37/261* (2013.01);

(Continued)

(58) Field of Classification Search
USPC ................ 250/305, 306, 307, 309, 310, 311, 250/440.11, 441.11, 442.11, 443.1
See application file for complete search history.

(56) References Cited

U.S. PATENT DOCUMENTS 5,406,087 A    4/1995    Fujiyoshi et al.
8,059,271 B2   11/2011   Marsh et al.
(Continued)

FOREIGN PATENT DOCUMENTS

JP    51-267    1/1976
JP    10-206748    8/1998
(Continued)

OTHER PUBLICATIONS

International Search Report in PCT/JP2013/066776, dated Jul. 30, 2013.
(Continued)

*Primary Examiner* — Nicole Ippolito
(74) *Attorney, Agent, or Firm* — Mattingly & Malur, PC

(57) ABSTRACT

An object of the invention is to provide an electron microscope which can easily and safely prepare a gas or liquid environment in the electron microscope and can observe a specimen in the environment and a reaction of the specimen at a high resolution and to provide a specimen holder for the electron microscope. In the electron microscope including specimen holding means (6) for holding a specimen (23), the specimen (23) is placed in a capillary (17) through which electron beams are transmittable, the electron microscope includes a supply device for supplying gas or liquid into the capillary (17) and a collection device for collecting the gas or the liquid, and the electron microscope obtains a specimen image of the specimen while flowing the gas or the liquid.

32 Claims, 8 Drawing Sheets

(52) U.S. Cl.
CPC ...... *H01J 2237/006* (2013.01); *H01J 2237/063* (2013.01); *H01J 2237/2001* (2013.01); *H01J 2237/2002* (2013.01); *H01J 2237/2003* (2013.01); *H01J 2237/2007* (2013.01); *H01J 2237/2448* (2013.01); *H01J 2237/2602* (2013.01)

(56) References Cited

U.S. PATENT DOCUMENTS

| | | | |
|---|---|---|---|
| 8,102,523 B1 | 1/2012 | Marsh et al. | |
| 2011/0057100 A1* | 3/2011 | Nakazawa et al. | 250/307 |
| 2011/0079710 A1 | 4/2011 | Damiano, Jr. et al. | |
| 2011/0303845 A1* | 12/2011 | Yaguchi | H01J 37/20 250/310 |
| 2012/0025103 A1 | 2/2012 | Deshmukh et al. | |
| 2012/0112062 A1* | 5/2012 | Novak et al. | 250/307 |
| 2012/0292507 A1* | 11/2012 | Morikawa et al. | 250/307 |

FOREIGN PATENT DOCUMENTS

| | | | |
|---|---|---|---|
| JP | 2003-187735 | 7/2003 | |
| JP | 2009-283477 | 12/2009 | |
| WO | WO 2010/092747 | * 8/2010 | H01J 37/20 |

OTHER PUBLICATIONS

Translation of the German Office Action received in corresponding German Application No. 112013003328.3 dated Feb. 19, 2015.

Liu, K-L. et al., Novel microchip for in situ TEM imaging of living organisms and bio-reactions in aqueous conditions, Lab on a Chip, 2008.

Gai, P. L., Development of Wet Environmental TEM (Wet-ETEM) for in Situ Studies of Liquid-Catalyst Reactions on the Nanoscale, Microscopy and Microanalysis, 2002, p. 21-28.

Bogner, A. et al., Wet STEM: A new development in environmental SEM for imaging nano-objects included in a liquid phase, Ultramicroscopy, 2005, p. 290-301.

Translation of Japanese Office Action received in corresponding Japanese Application No. 2012-166492 dated Jan. 18, 2016.

* cited by examiner

ELECTRON MICROSCOPE AND ELECTRON MICROSCOPE SAMPLE RETAINING DEVICE

TECHNICAL FIELD

The present invention relates to an electron microscope and a specimen holder included in the electron microscope.

BACKGROUND ART

PTL 1 discloses an example where, by using, as a member for observing, in real time, a state in which a specimen is reacted with gas at a high temperature, an electron microscope or the like in which a specimen holder including a capillary tube for spraying gas toward a heater for heating the specimen is provided, such a gas reaction at the high temperature is observed. PTL 2 discloses an electron microscope in which gas is introduced in a horizontal direction, however, a specimen holder has openings for allowing electron beams to pass therethrough in a vertical direction. PTL 3 discloses an example where a capillary that can house a specimen has a rotation mechanism and is placed on a stage of the microscope.

CITATION LIST

Patent Literatures

PTL 1: JP-A-2003-187735
PTL 2: JP-A-51-267
PTL 3: JP-A-10-206748

SUMMARY OF INVENTION

Technical Problem

In the conventional art described above, in a structure for introducing gas and liquid into cells between which a gas environment and a vacuum are separated by overlapping separating membranes, it is necessary to adhere cell parts or perform sealing with the use of a gasket or the like in order to prevent the gas and the liquid from leaking from the cells. Therefore, there is a problem that assembly of the cells and attachment thereof to a specimen support are complicated. Further, there is a problem that the gas and the liquid are leaked due to unsatisfactory sealing.

In order to perform three-dimensional observation of a specimen under an optical microscope, the other conventional art described above discloses a method in which the specimen is placed in a capillary and is observed while being rotated. The other conventional art does not consider a case of using an electron microscope. Further, the other conventional art does not also consider a case where gas or liquid to react with the specimen is filled in the capillary or a case where the specimen in an environment of the gas or the liquid is heated and is superimposed with a voltage and a reaction thereof is observed.

An object of the invention is to provide an electron microscope which can easily and safely prepare a gas or liquid environment or a gas-liquid mixed stream solution environment in the electron microscope and can observe a specimen in the environment and a reaction of the specimen at a high resolution and to provide a specimen holder for the electron microscope.

Solution to Problem

In view of the problems, the invention has a structure below. An electron microscope including: an electron source for discharging primary electron beams; electron beam control means for condensing the primary electron beams discharged from the electron source and irradiating a specimen with the primary electron beams; a detector for detecting an electron generated from the specimen; a calculation device for preparing a specimen image on the basis of a signal from the detector; display means for displaying the specimen image; means for recording the displayed specimen image; and specimen holding means for holding the specimen, wherein: the specimen is placed in a capillary through which the primary electron beams are transmittable; the electron microscope includes a supply device for supplying gas or liquid into the capillary and a collection device for collecting the gas or the liquid; and the electron microscope obtains the specimen image of the specimen while flowing the gas or the liquid.

Advantageous Effects of Invention

According to the invention, a change of a specimen can be observed at a high resolution by forming, with a simple structure, a minute gas space, a minute liquid space, or a mixed space of the gas and the liquid, each space containing the specimen in a specimen chamber of an electron microscope, and heating the specimen therein or applying a voltage to the specimen therein.

DESCRIPTION OF EMBODIMENTS

Figure 1:
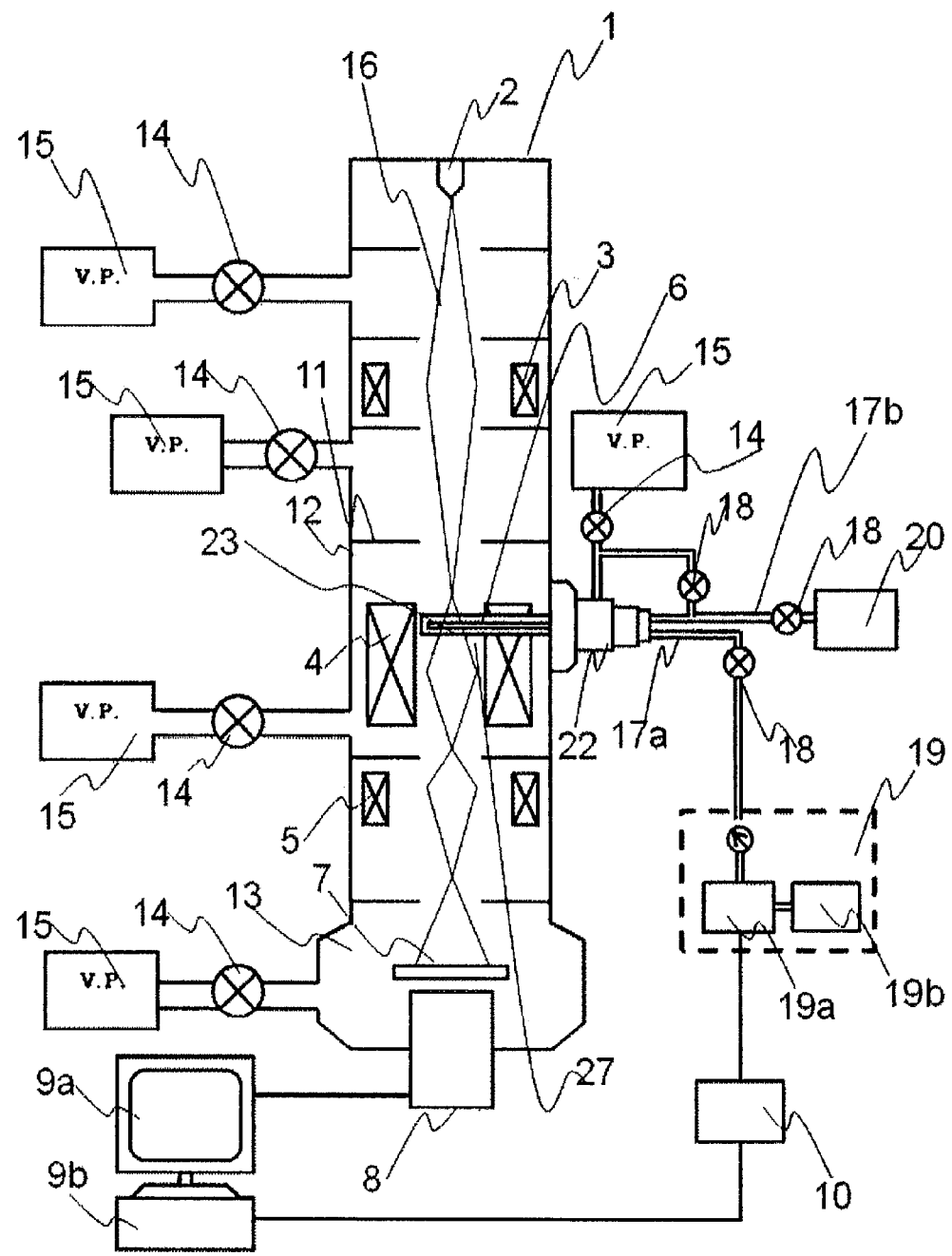
FIG. 1 is a basic structure diagram of an electron beam apparatus in one example of the invention.

FIG. 1 is a basic structure diagram of an electron microscope 1 in one example of the invention. A column of the electron microscope 1 includes an electron gun 2, condenser lenses 3, objective lenses 4, and projection lenses 5. A specimen holder 6 for an electron microscope is inserted between the objective lenses 4. A fluorescent screen 7 is provided below the projection lenses 5, and a TV camera 8 is provided below the fluorescent screen 7. The TV camera 8 is connected to an image recording unit 9b via an image display unit 9a and can capture a moving image. The image recording unit 9b is connected to a specimen-environment-control unit 10.

Apertures 11 for differential pumping are provided between the condenser lenses 3 and the objective lenses 4. A space between the electron gun 2 and the condenser lenses 3, a space between the condenser lenses 3 and the objective lenses 4, an electron microscope specimen chamber 12, and an observation chamber 13 are connected to different vacuum pumps 15 via respective valves 14. The specimen holder 6 for an electron microscope includes, in a tip portion thereof, a tubular or square capillary 17 having a thick portion through which electron beams 16 are transmittable, and an inlet 17a and an outlet end surface 17b of the capillary are communicated to outside of the column of the electron microscope 1. The inlet end surface 17a of the capillary is connected to a gas•liquid supply device 19 via a valve 18. The gas•liquid supply device 19 includes a flow-rate control unit 19a and a store unit 19b, and is connected to the environment control unit 10.

The outlet end surface 17b of the capillary is branched, and, in a case where an introduction environment is gas, one branched end surface is connected to an evacuation pump 20 via the opening-closing valve 18, meanwhile, in a case where the introduction environment is liquid, the one branched end surface is connected to a collection container 21 instead of the evacuation pump 20. The other branched end surface is connected to the vacuum pump 15 via the valve 14.

The electron microscope specimen chamber 12 is connected to a specimen pre-evacuation chamber 22, and the specimen pre-evacuation chamber 22 is connected to the vacuum pump 15 via the valve 14.

A specimen 23 is attached to a tip of a bar-shaped specimen fixing unit 24, and is placed on a part in the capillary 17, the part being a part through which electron beams are transmittable. In a case where the specimen 23 is dispersed in a solution, the specimen 23 floated in the capillary 17 or the specimen 23 adhered to a wall surface thereof and the tip of the specimen fixing unit 24 is observed.

The electron beams 16 generated from the electron gun 2 are condensed by the condenser lenses 3 to thereby irradiate the specimen 23. The electron beams 16 that have transmitted through the specimen 23 are imaged by the objective lenses 4, are magnified by the projection lenses 5, and are projected onto the fluorescent screen 7. Alternatively, the fluorescent screen 7 is lifted, the electron beams 16 are projected onto the TV camera 8, and a transmission image is displayed in the image display unit 9a and is recorded in the image recording unit 9b.

In a case where the specimen holder 6 for an electron microscope is inserted into the electron microscope specimen chamber 12, inside of the capillary 17 of the specimen holder 6 for an electron microscope is slowly evacuated in advance by the vacuum pump 15 in the specimen pre-evacuation chamber 22 at the same time when the specimen pre-evacuation chamber 22 is evacuated, and is then inserted into the electron microscope specimen chamber 12. A desired gas•liquid flow rate and a desired pressure in an environment in the vicinity of the specimen are inputted in the specimen-environment-control unit 10 and are set to be desired conditions in the supply device 19. Gas, liquid, and a mixed fluid thereof are supplied from the supply device 19, and the gas, the liquid, and the mixed fluid are introduced into the capillary 17. A transmission image of the specimen 23 in an environment of the gas, the liquid, and the mixed fluid is captured by the TV camera 8. The transmission image is displayed in the image display unit 9a and is continuously recorded in the image recording unit 9b. In the specimen-environment-control unit 10, an environment condition in the vicinity of the specimen 23 is constantly monitored and is recorded while being synchronized with a counter of the image recording unit 9b. The gas introduced into the capillary is evacuated by the vacuum pump 20 connected to the outlet end surface 17b of the capillary or is collected by the collection container 21 connected to the outlet end surface 17b thereof. Conditions such as a flow rate, a pressure, and a temperature and a humidity in an environment, and a video counter during operation of the apparatus are recorded in the specimen-environment-control unit 10.

Figure 2A:
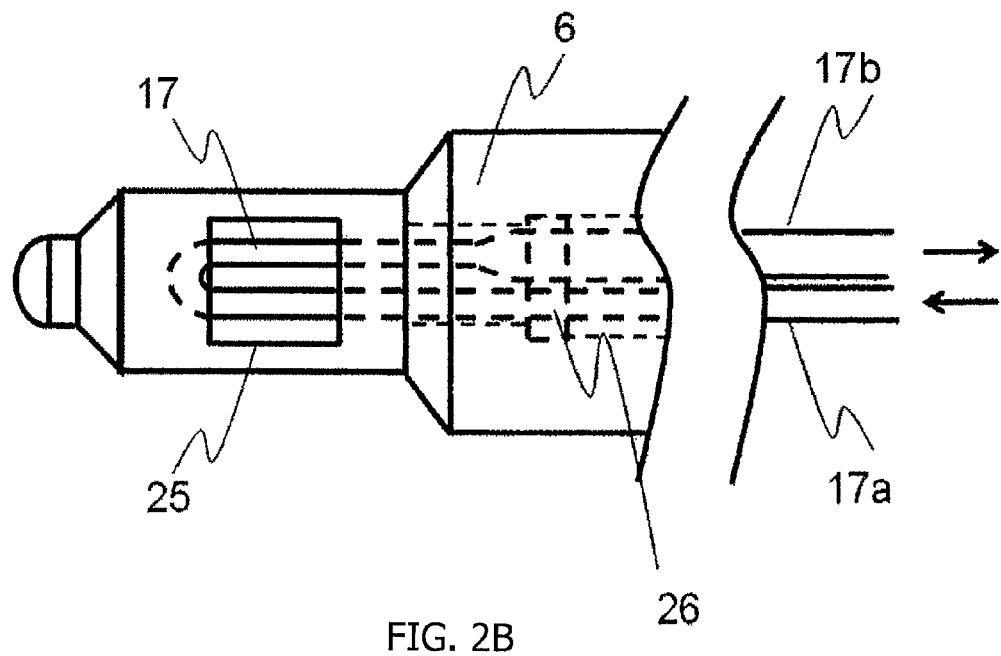
FIGS. 2A and 2B are basic structure diagrams of a tip portion of a specimen holder for an electron microscope in one example.
Figure 2B:
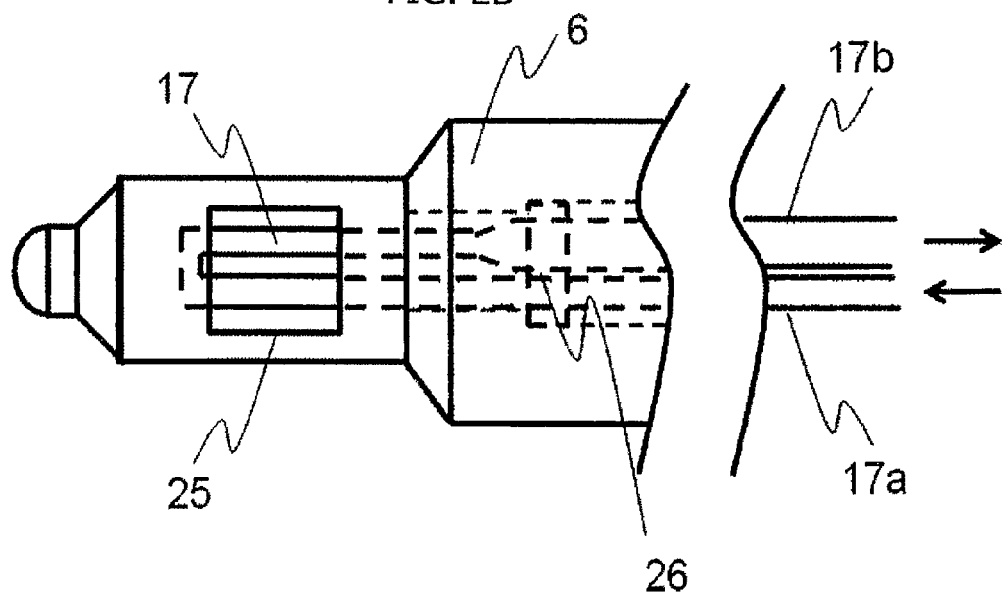

FIGS. 2A and 2B are a basic structure diagram of the tip portion of the specimen holder 6 for an electron microscope in one example of the invention. The tubular or square capillary 17 is fixed to have a U-shape in the tip portion of the specimen holder 6 for an electron microscope. An electron beam passage hole 25 is provided in the tip portion of the specimen holder 6 for an electron microscope, and a part of the capillary 17 is located in the passage hole part 25. Outside of the part of the capillary 17 set in the passage hole part 25 is coated with carbon having a thickness of 20 nm or less in order to prevent charging up by irradiation electron beams. A shaft part of the specimen holder 6 for an electron microscope is hollow, and the capillary 17 is inserted into the hollow part. A thickness of a wall of the capillary 17 set in the passage hole part 25 is a thickness through which the electron beams 16 are transmittable. The thickness of the capillary only needs to be changed in accordance with a condition of an acceleration voltage of the electron beams 16. A gasket 26 is attached to the capillary 17 in the shaft part in order to separate a vacuum in the tip portion of the specimen holder 6 for an electron microscope from a vacuum in the shaft part. An internal diameter on an evacuation side of the capillary 17 is larger than that on an introduction side thereof so as to perform evacuation more efficiently. The capillary 17 can be removed together with the gasket 26 from a back end part of the specimen holder 6 for an electron microscope.

Figure 3A:
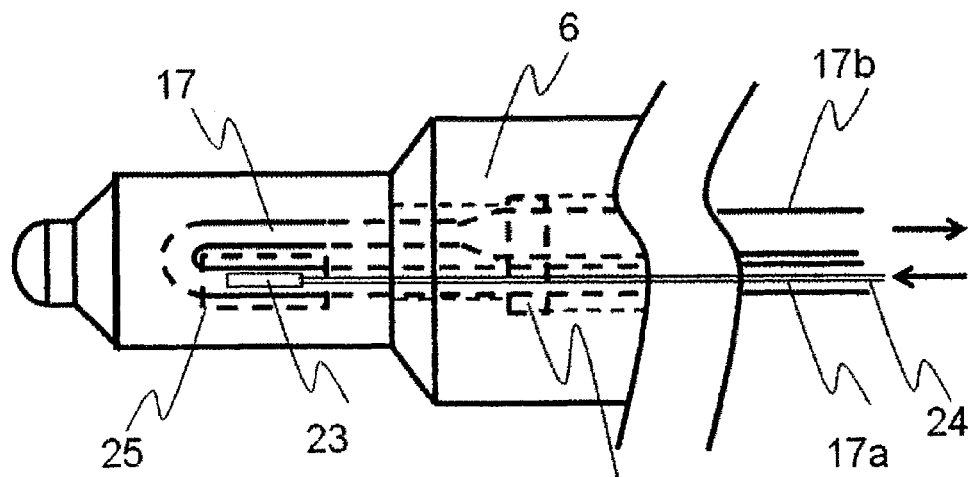
FIGS. 3A and 3B illustrate a tip portion of a specimen holder for an electron microscope in one example.
Figure 3B:
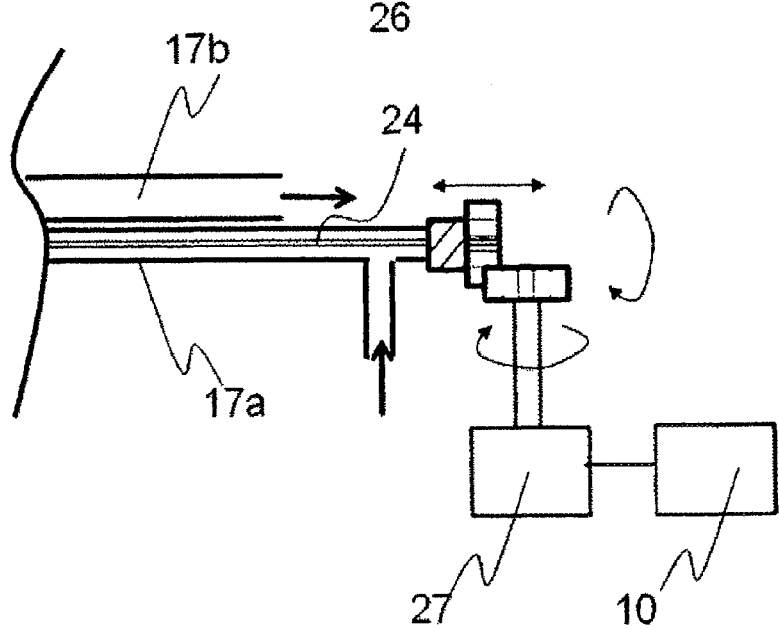

FIGS. 3A and 3B illustrate the tip portion of the specimen holder 6 for an electron microscope in one example of the invention. The specimen 23 is attached to the tip of the bar-shaped specimen fixing unit 24. The specimen 23 itself may be directly fixed to the fixing unit 24. Alternatively, by attaching, to the tip of the fixing unit 24, a mesh-like support which is stretched with a polymeric membrane or the like and which has a size that can be inserted into the capillary 17, the specimen 23 may be placed on the mesh-like support. A terminal of the bar-shaped specimen fixing unit 24 is pulled out together with the capillary 17 to outside of the column, and is connected to the rotation mechanism 27. The specimen can be turned by 360 degrees and can be moved in a horizontal direction in the capillary by the rotation mechanism 27. The mesh attached to the tip of the specimen fixing unit 24 can be also used to collect the specimen 23 in introduced gas or an introduced solution. The rotation mechanism 27 is connected to the specimen-environment-control unit 10 via a specimen rotation control unit 28.

Figure 4:
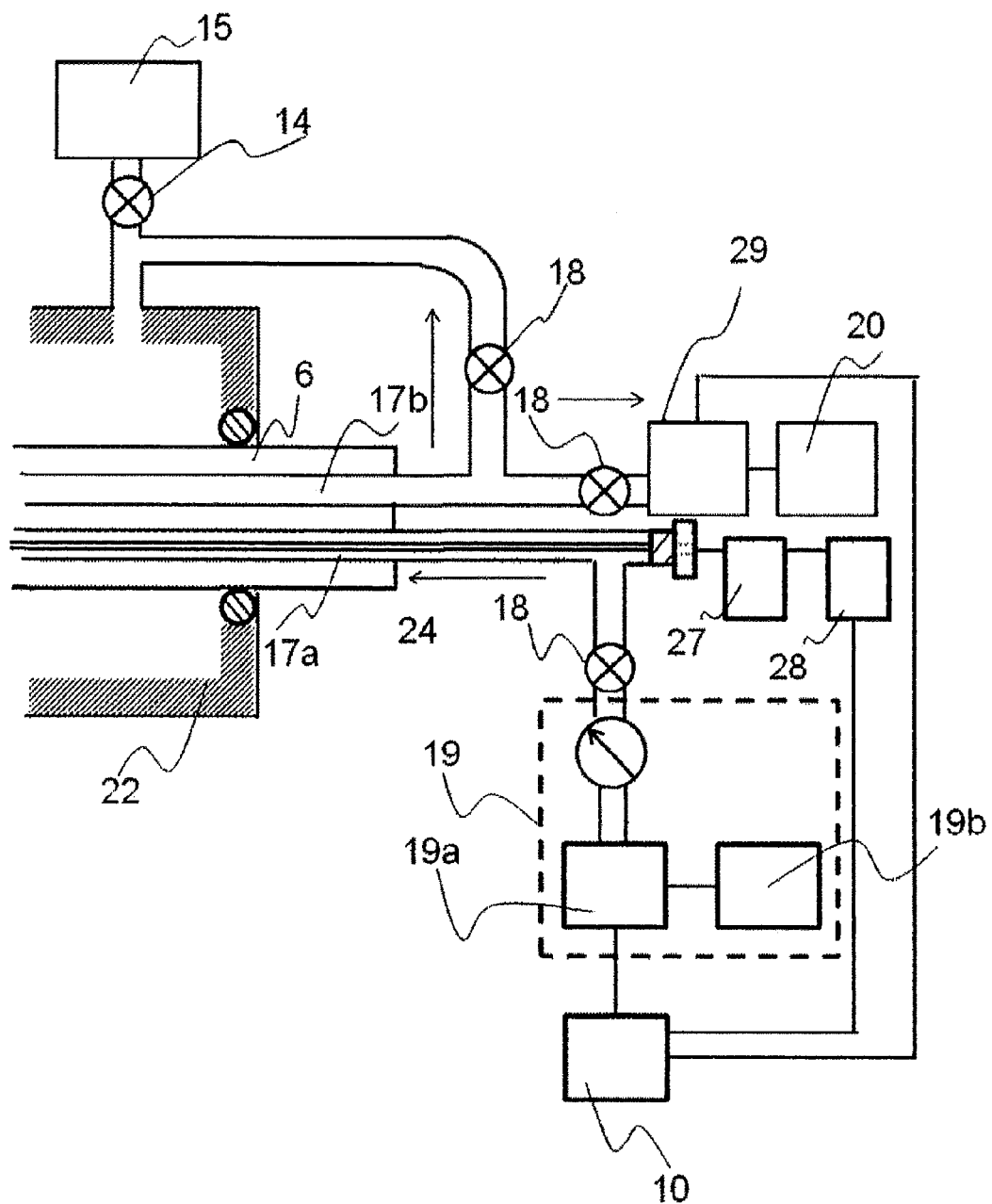
FIG. 4 is a structure diagram of a specimen pre-evacuation chamber of an electron microscope 1 and a specimen holder for an electron microscope in one example.

FIG. 4 is a structure diagram of the specimen pre-evacuation chamber 22 of the electron microscope 1 and the specimen holder 6 for an electron microscope in one example of the invention. A terminal part of the specimen holder 6 is provided outside the column, and the inlet end surface 17a and the outlet end surface 17b of the capillary incorporated into the holder 6 are also provided outside the column. The inlet end surface 17a of the capillary is connected to the gas•liquid supply device 19 via the valve 18. The gas•liquid supply device 19 includes the flow-rate control unit 19a and the store unit 19b, and is connected to the environment control unit 10. The specimen rotation mechanism 27 provided in the inlet end surface 17a of the capillary is connected to the environment control unit 10 via the specimen rotation control unit 28, and an angle of the specimen during operation of the apparatus is recorded together with an image in the environment control unit 10.

The specimen pre-evacuation chamber 22 is connected to the vacuum pump 15 via the slow leak valve 14, and a branched one of the capillary outlet end surface 17b of the specimen holder 6 is connected to the vacuum pump 15 via the opening-closing valve 18 and the slow leak valve 14. The other branched one of the capillary outlet end surface 17b is connected to the collection container 21 or a mass spectrometer 29 via the valve 18. The mass spectrometer 29 is connected to the vacuum pump 20 and the specimen-environment-control unit 10. By introducing gas into the capillary 17 and then analyzing the evacuated gas, it is possible to analyze a reaction product in the capillary 17 and to associate this analysis with an observation result. A result of the analysis is recorded together with a specimen environment condition in the specimen-environment-control unit 10.

Figure 5A:
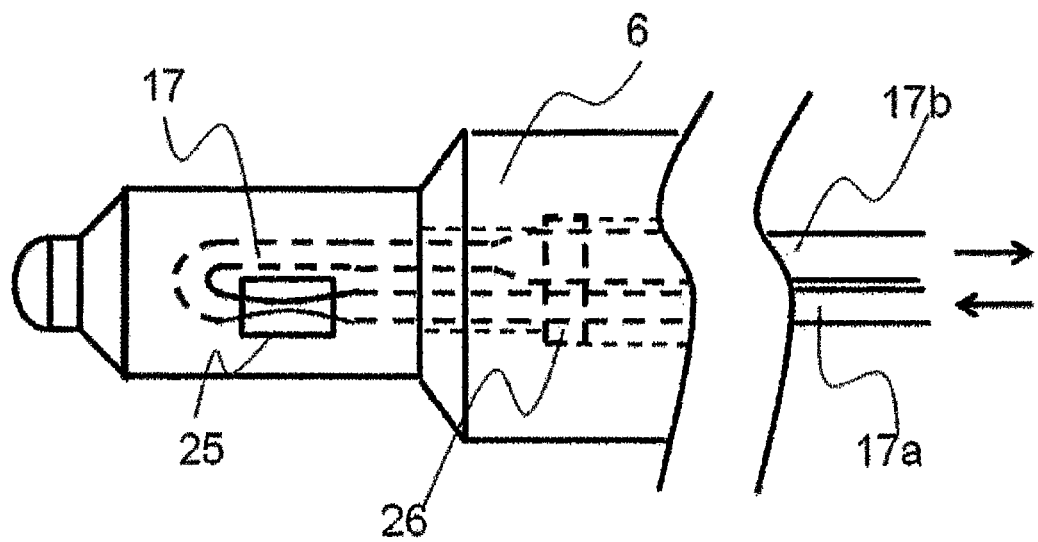
FIGS. 5A and 5B are a top view (a) and a cross-sectional view, respectively, of a tip portion of a specimen holder for an electron microscope in one example.
Figure 5B:
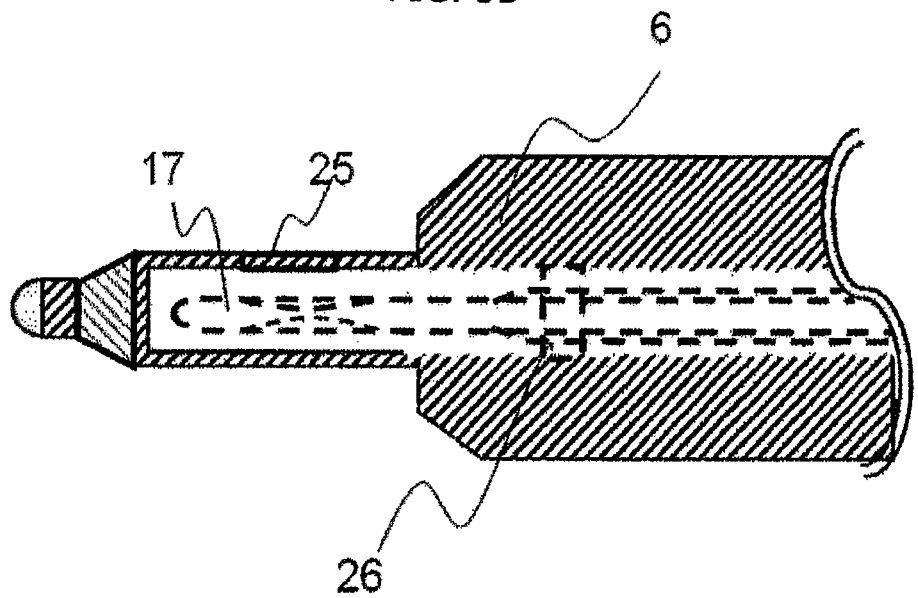

FIGS. 5A and 5B are a top view (a) and a cross-sectional view (b) of the tip portion of the specimen holder 6 for an electron microscope in another example of the invention. A diameter of a part of the capillary 17 on a gas and liquid introduction side is reduced, and the part has the electron beam passage hole 25. This makes it possible to prevent an image from blurring due to large scattering of electron beams because of gas and liquid, and therefore it is possible to make observations at a high resolution.

Figure 6A:
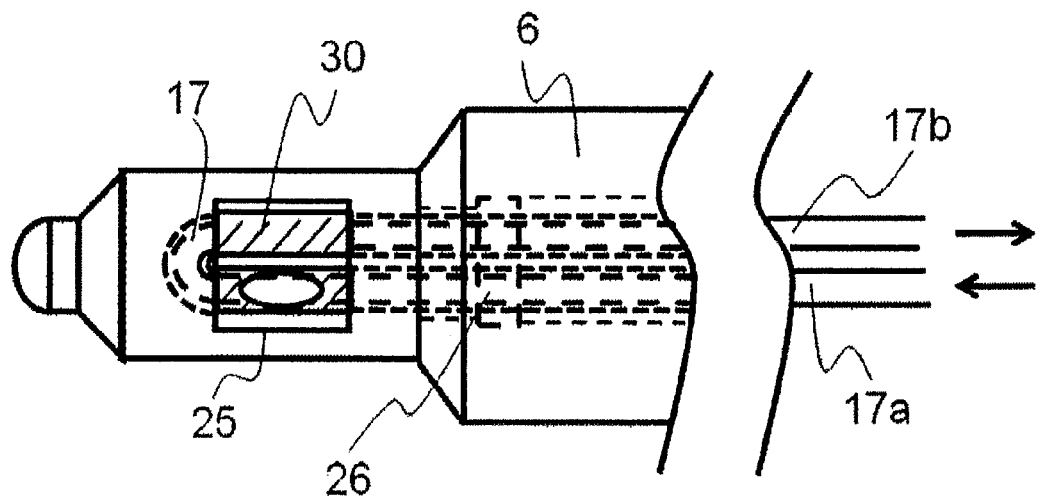
FIGS. 6A and 6B are top views of a tip portion of a specimen holder for an electron microscope in one example.
Figure 6B:
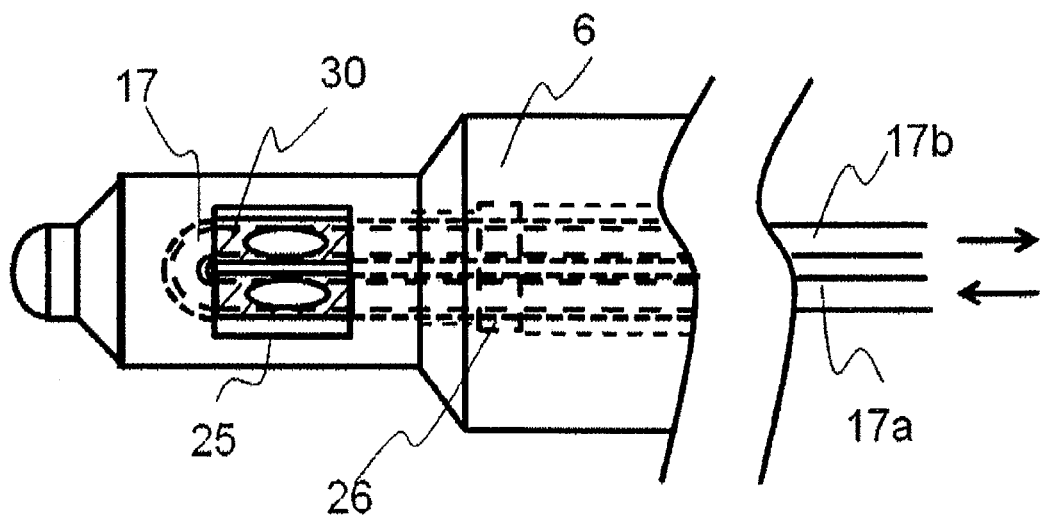

FIGS. 6A and 6B are a top view of the tip portion of the specimen holder 6 for an electron microscope in another example of the invention. A part other than an electron-beam-16 transmission part of the capillary 17 through which the electron beams 16 are transmittable is covered by a metal membrane or a conductive resin membrane 30. Therefore, it is possible to prevent decrease in pressure resistance, heat resistance, and mechanical strength.

Figure 7A:
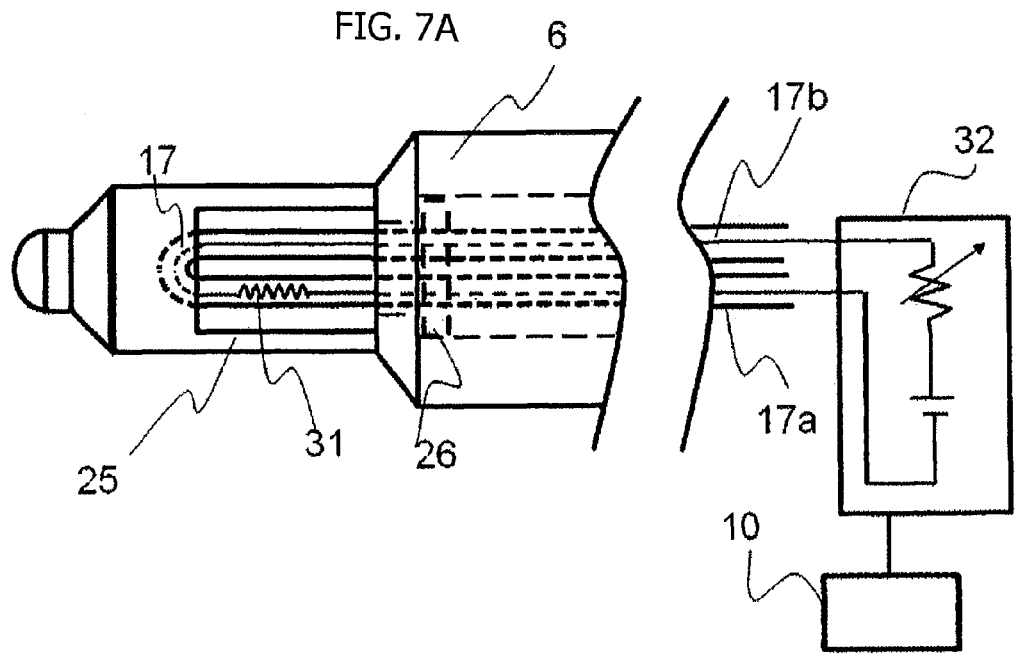
FIGS. 7A and 7B are top views of a tip portion of a specimen holder for an electron microscope in one example.
Figure 7B:
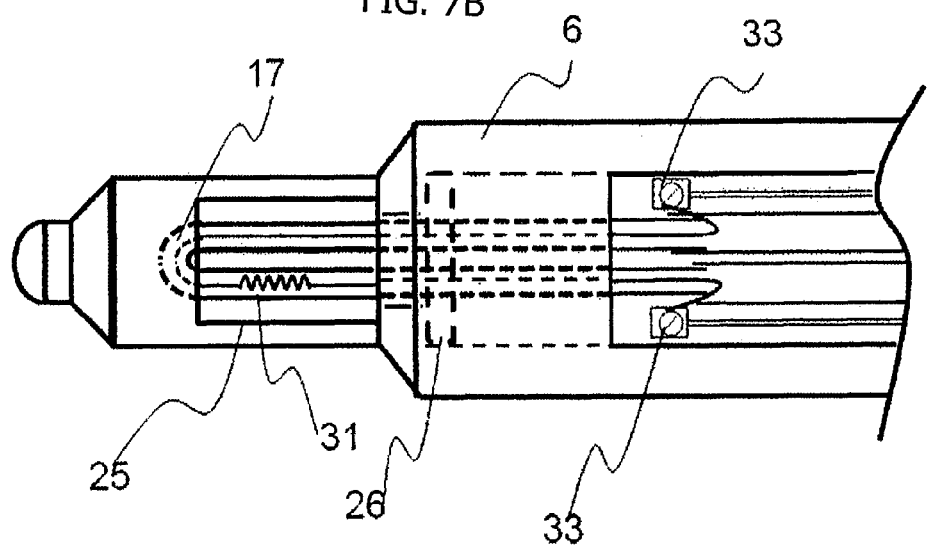

FIGS. 7A and 7B are a top view (a) of the tip portion of the specimen holder 6 for an electron microscope in another example of the invention. A heater 31 is provided in the electron-beam-16 transmission part of the capillary 17 through which the electron beams 16 are transmittable, and the specimen 23 is directly adhered to the heater part 31. Both ends of the heater 31 are pulled out to outside of the capillary 17 and are connected to a power supply 32 for heating. The power supply 32 for heating is connected to the specimen-environment-control unit 10, and a heating condition is recorded in the environment control unit 10. Therefore, it is possible to observe a change of the specimen 23 at a high temperature in gas. Alternatively, as illustrated FIG. 7B, the U-shaped capillary 17 is provided only in the tip portion of the specimen holder 6, and an end portion of the heater 31 set in the capillary 17 is connected to electrodes 33 provided on an outside part of the gasket 26 for separating a vacuum. Therefore, it is easy to adjust a position of the heater 31 and fix the specimen 23 to the heater 31.

Figure 8:
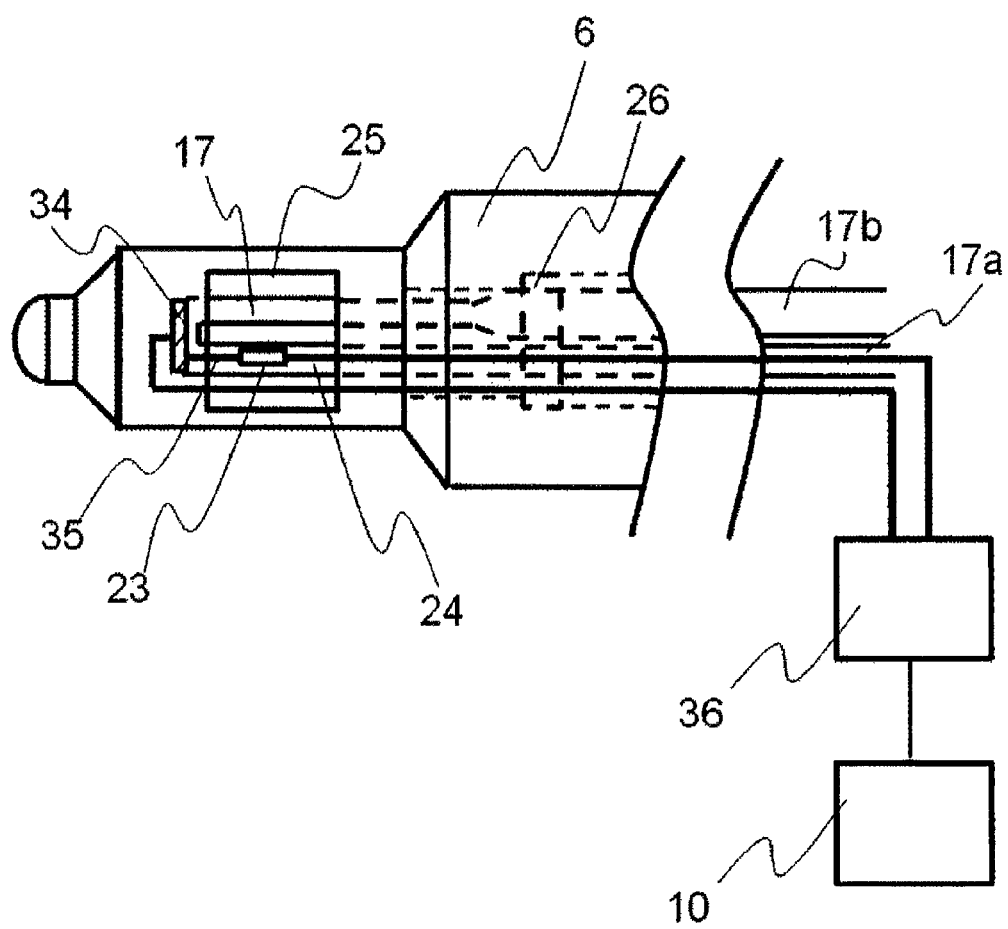
FIG. 8 illustrates a tip portion of a specimen holder for an electron microscope in an example.

FIG. 8 illustrates the tip portion of the specimen holder 6 for an electron microscope in another example of the invention. A part of the capillary 17 in the tip portion of the specimen holder 6 for an electron microscope is covered by a hole cup 34 made from metal, and a metal plate 35 extending into the capillary 17 is provided to the hole cup 34. The specimen 23 is attached to the tip of the specimen fixing unit 24, and is brought into contact with the metal plate 35. Another end part of the specimen fixing unit 24 which is taken out to outside of the column of the microscope 1, and a superimposed voltage power supply unit 36 for superimposing a voltage to a metal plate 35 attached to the metal hole cup part 34 in the capillary 17 are provided. The superimposed voltage power supply unit 36 is connected to the specimen-environment-control unit 10, and a condition is recorded in the environment control unit 10.

Therefore, it is possible to superimpose a voltage to the specimen 23 in gas and liquid and dynamically observe a change of the specimen 23.

REFERENCE SIGNS LIST 1 electron microscope
2 electron gun
3 condenser lens
4 objective lens
5 projection lens
6 specimen holder for electron microscope
7 fluorescent screen
8 TV camera
9a image display unit
9b image recording unit
10 specimen-environment-control unit
11 differential pumping aperture
12 electron microscope specimen chamber
13 observation chamber
14 valve
15 vacuum pump
16 electron beam
17 capillary
17a capillary inlet
17b capillary outlet
18 opening-closing valve
19 gas•liquid supply device
19a flow rate control unit
19b store unit
20 evacuation pump
21 collection container
22 specimen pre-evacuation chamber
23 specimen
24 specimen fixing unit
25 electron beam passage hole
26 gasket
27 rotation mechanism
28 specimen rotation control unit
29 mass spectrometer
30 metal or conductive resin membrane
31 heater
32 power supply for heating
33 electrode
34 hole cup
35 metal plate
36 superimposed voltage power supply unit

The invention claimed is:

1. A specimen holder of an electron microscope, comprising:
   a hollow housing having a tip portion;
   a capillary holding a sample therein,
   wherein one end of the capillary includes an inlet portion supplying a reaction medium and another end of the capillary includes an outlet portion exhausting the reaction medium,
   wherein the capillary has a U-shaped portion disposed within the tip portion of the hollow housing.

2. The specimen holder according to claim 1,
   wherein at least a first portion of the capillary disposed within the tip portion of the hollow housing has a thickness permitting transmission of a charged particle beam of the electron microscope.

3. The specimen holder according to claim 2,
   wherein an outer surface of the first portion of the capillary is coated with carbon.

4. The specimen holder according to claim 3 further comprising:
a membrane comprising at least one of metal and conductive resin, covering a second portion of the capillary other than the first portion.

5. The specimen holder according to claim 4,
wherein an internal diameter on an evacuation side of the capillary is greater than an internal diameter of an introduction side.

6. The specimen holder according to claim 5,
wherein a diameter of the first portion is less than a diameter of the second portion.

7. The specimen holder according to claim 6 further comprising:
a heater disposed within the first portion of the capillary,
wherein the sample is adhered to the heater.

8. The specimen holder according to claim 7 further comprising:
a bar-shaped portion configured to connect to the sample in the capillary;
a driving unit configured to connect to an end portion of the bar-shaped portion,
wherein the sample is at least rotated by operation of the driving unit.

9. The specimen holder according to claim 8 further comprising:
a voltage supplying unit configured to supply the sample with voltage.

10. The specimen holder according to claim 1,
wherein an outer surface of a first portion of the capillary disposed within the tip portion of the hollow housing is coated with carbon.

11. The specimen holder according to claim 1 further comprising:
a membrane comprising at least one of metal and conductive resin, covering a portion of the capillary other than a portion irradiated by a charged particle beam of an electron microscope.

12. The specimen holder according to claim 1,
wherein an internal diameter on an evacuation side of the capillary is greater than an internal diameter of an introduction side of the capillary.

13. The specimen holder according to claim 1,
wherein a first portion of the capillary disposed within the tip portion of the hollow housing has a diameter less than a diameter of a second portion of the capillary other than the first portion.

14. The specimen holder according to claim 1, further comprising:
a heater disposed within a first portion of the capillary within the tip portion of the hollow housing,
wherein the sample is adhered to the heater.

15. The specimen holder according to claim 1 further comprising:
a bar-shaped portion configured to connect to the sample in the capillary;
a driving unit configured to connect to an end portion of the bar-shaped portion,
wherein the sample is at least rotated by operation of the driving unit.

16. The specimen holder according to claim 1, further comprising:
a voltage supplying unit configured to supply the sample with voltage.

17. An electron microscope, comprising:
an electron source discharging primary electron beams and irradiating a specimen with the primary electron beams;
a detector for detecting an electron generated from the specimen;
a calculation device for preparing a specimen image based on a signal from the detector;
a specimen holder holding the specimen, comprising:
a hollow housing having a tip portion;
a capillary holding the sample therein,
wherein one end of the capillary includes an inlet portion supplying a reaction medium and another end of the capillary includes an outlet portion exhausting the reaction medium,
wherein the capillary has a U-shaped portion disposed within the tip portion of the hollow housing.

18. The electron microscope according to claim 17,
wherein at least a first portion of the capillary disposed within the tip portion of the hollow housing has a thickness permitting transmission of a charged particle beam of the electron microscope.

19. The electron microscope according to claim 18,
wherein an outer surface of the first portion of the capillary is coated with carbon.

20. The electron microscope according to claim 19 further comprising:
a membrane disposed within the specimen holder comprising at least one of metal and conductive resin, covering a second portion of the capillary other than the first portion.

21. The electron microscope according to claim 20,
wherein an internal diameter on an evacuation side of the capillary is greater than an internal diameter of an introduction side.

22. The electron microscope according to claim 21,
wherein a diameter of the first portion is less than a diameter of the second portion.

23. The electron microscope according to claim 22, further comprising:
a heater disposed within the first portion of the capillary,
wherein the sample is adhered to the heater.

24. The electron microscope according to claim 23 further comprising:
a bar-shaped portion configured to connect to the sample in the capillary;
a driving unit configured to connect to an end portion of the bar-shaped portion,
wherein the sample is at least rotated by operation of the driving unit.

25. The electron microscope according to claim 24 further comprising:
a voltage supplying unit configured to supply the sample with voltage.

26. The electron microscope according to claim 17,
wherein an outer surface of a first portion of the capillary disposed within the tip portion of the hollow housing is coated with carbon.

27. The electron microscope according to claim 17 further comprising:
a membrane disposed within the specimen holder comprising at least one of metal and conductive resin, covering a portion of the capillary other than a portion irradiated by a charged particle beam of an electron microscope.

28. The electron microscope according to claim 17,
wherein an internal diameter on an evacuation side of the capillary is greater than an internal diameter of an introduction side of the capillary.

29. The electron microscope according to claim 17,
wherein a first portion of the capillary disposed within the tip portion of the hollow housing has a diameter less than a diameter of a second portion of the capillary other than the first portion.

30. The electron microscope according to claim 17, further comprising:
a heater disposed within a first portion of the capillary within the tip portion of the hollow housing,
wherein the sample is adhered to the heater.

31. The electron microscope according to claim 17 further comprising:
a bar-shaped portion configured to connect to the sample in the capillary;
a driving unit configured to connect to an end portion of the bar-shaped portion,
wherein the sample is at least rotated by operation of the driving unit.

32. The electron microscope according to claim 17, further comprising:
a voltage supplying unit configured to supply the sample with voltage.

\* \* \* \* \*